(12) United States Patent
Jeong et al.

(10) Patent No.: US 7,598,594 B2
(45) Date of Patent: Oct. 6, 2009

(54) WAFER-SCALE MICROCOLUMN ARRAY USING LOW TEMPERATURE CO-FIRED CERAMIC SUBSTRATE

(75) Inventors: Jin Woo Jeong, Daegu (KR); Dae Jun Kim, Daejeon (KR); Sang Kuk Choi, Daejeon (KR); Dae Yong Kim, Daejeon (KR); Ho Seob Kim, Chungcheongnam-do (KR)

(73) Assignees: Electronics and Telecommunications Research Institute, Daejeon (KR); Industry-University Cooperation Foundation Sunmoon University, Chungcheongnam-do (KR)

( * ) Notice: Subject to any disclaimer, the term of this patent is extended or adjusted under 35 U.S.C. 154(b) by 446 days.

(21) Appl. No.: 11/259,959

(22) Filed: Oct. 24, 2005

(65) Prior Publication Data

US 2006/0131698 A1    Jun. 22, 2006

(30) Foreign Application Priority Data

Dec. 20, 2004    (KR) ...................... 10-2004-0109002
Jun. 16, 2005    (KR) ...................... 10-2005-0051981

(51) Int. Cl.
*H01L 29/06* (2006.01)
*H01L 21/3205* (2006.01)
*G01N 23/00* (2006.01)

(52) U.S. Cl. .................. 257/618; 438/594; 250/311
(58) Field of Classification Search ................ 257/618; 438/664, 694; 250/311
See application file for complete search history.

(56) References Cited

U.S. PATENT DOCUMENTS 5,637,539 A    6/1997    Hofmann et al.
6,145,438 A    11/2000   Berglund et al.
6,369,385 B1   4/2002    Muray et al.
6,498,348 B2 * 12/2002   Aitken ................ 250/396 ML
6,524,756 B1 *  2/2003   Wu ............................. 430/5
6,914,249 B2 *  7/2005   Kienzle et al. .......... 250/396 R
6,989,546 B2 *  1/2006   Loschner et al. ....... 250/492.22

(Continued)

FOREIGN PATENT DOCUMENTS

KR    10-2004-0033601    *    4/2004

(Continued)

OTHER PUBLICATIONS

"Experimental Evaluation of Arrayed Microcolumn with a Monolithic Structure", J. Jeong, et al., MNC2004 Digest, Oct. 27-29, 2004, 4 pages.

(Continued)

*Primary Examiner*—Howard Weiss
*Assistant Examiner*—Steven H Rao
(74) *Attorney, Agent, or Firm*—Blakely Sokoloff Taylor & Zafman

(57) ABSTRACT

Provided is a wafer-scale microcolumn array using a low temperature co-fired ceramic (LTCC) substrate. The microcolumn array includes a LTCC substrate having wirings and wafer-scale beam deflector arrays, which are attached to at least one side of the LTCC substrate and has an array of deflection devices deflecting electron beams. The wafer-scale microcolumn array using the LTCC substrate makes it possible to significantly increase the throughput of semiconductor wafers, simplify its manufacturing process, and lower its production cost.

11 Claims, 8 Drawing Sheets

U.S. PATENT DOCUMENTS

| | | | |
|---|---|---|---|
| 7,109,486 B1 * | 9/2006 | Spallas et al. | 250/311 |
| 7,135,677 B2 * | 11/2006 | Kienzle et al. | 250/310 |
| 2005/0018165 A1 * | 1/2005 | Akutsu | 355/72 |
| 2005/0053844 A1 * | 3/2005 | Wu | 430/5 |
| 2006/0029955 A1 * | 2/2006 | Guia et al. | 435/6 |
| 2006/0076249 A1 * | 4/2006 | Meisegeier et al. | 205/792 |
| 2006/0128155 A1 * | 6/2006 | Miyata et al. | 438/694 |

FOREIGN PATENT DOCUMENTS

| | | | |
|---|---|---|---|
| WO | WO 00/67290 | * | 11/2000 |

OTHER PUBLICATIONS

"Electron-beam microcolumns for lithography and related applications", T. Chang, et al., 1996 American Vacuum Society, J. Vac. Sci. Techolo. B B 14(6), Nov./Dec. 1996, pp. 3774-3781.

* cited by examiner

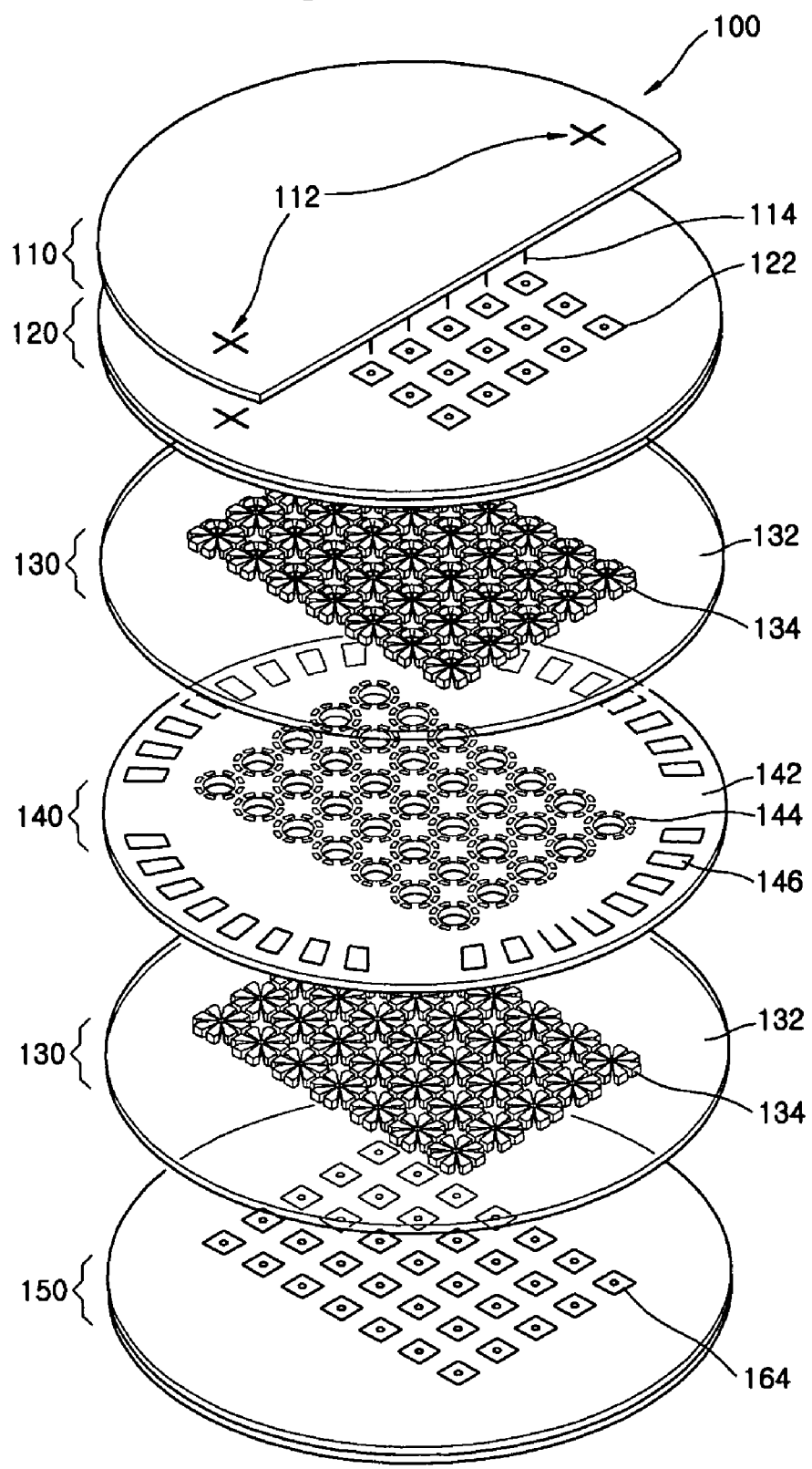

WAFER-SCALE MICROCOLUMN ARRAY USING LOW TEMPERATURE CO-FIRED CERAMIC SUBSTRATE

CROSS-REFERENCE TO RELATED PATENT APPLICATION

This application claims the benefit of Korean Patent Application Nos. 10-2004-0109002, filed on Dec. 20, 2004 and 10-2005-0051981, filed on Jun. 16, 2005, in the Korean Intellectual Property Office, the disclosures of which are incorporated herein in their entirety by reference.

BACKGROUND OF THE INVENTION

1. Field of the Invention

The present invention relates to an apparatus used in electron beam lithography, and more particularly, to a wafer-scale microcolumn array using a low temperature co-fired ceramic (LTCC) substrate.

2. Description of the Related Art

An electron beam microcolumn (hereinafter, referred to as a microcolumn) used for minutely focusing an electron beam was first introduced at the end of the 1980s. The microcolumn has advantages of small size, high resolution, and low production cost. The microcolumn has been applied to various fields, such as electron beam lithography, etc.

In general, the microcolumn includes an electron emission source, silicon electrostatic lenses, more than one octa-electrode electrostatic beam deflector, etc. The silicon electrostatic lens is a thin silicon film having holes of several μm to hundreds of μm in diameter formed by a typical MEMS (micro electro mechanical systems) process. The silicon electrostatic lens has high electric conductivity obtained, for example, by injecting boron impurities thereinto. The electrostatic lens has various apertures. The electrostatic lens performs as an electro-optical lenses, which restricts an electron beam emitted from an electron emission source and electrostatically converges the electron beam by an external voltage source. One octa-electrode electrostatic beam deflector has eight polygonal electrodes formed in a radial shape by, for example, reactive ion etching (RIE) of silicon. The electrostatic beam deflector bends electron beams passing through the center of the deflector using an electrostatic force generated by an externally applied voltage. The microcolumn has an advantage of low power consumption.

Meanwhile, if microcolumns are arrayed on a wafer-scale basis, a huge amount of wafers can be processed by a semiconductor lithography process in units of time. In general, the array of microcolumns is performed by wafer-scale arrangement of separately produced unit microcolumns, wafer-scale arrangement of monolithic microcolumns, or synchronous arrangement of a wafer-scale microcolumn. A method of forming wirings between a lens and a beam deflector using a semiconductor manufacturing process has been proposed in manufacturing a wafer-scale microcolumn. However, the use of the semiconductor manufacturing process has drawbacks in that the manufacturing process becomes too complicated and expensive.

SUMMARY OF THE INVENTION

The present invention provides a microcolumn array manufactured at low cost by a simple process.

According to an aspect of the present invention, there is provided a wafer-scale microcolumn array including a low temperature co-fired ceramic (LTCC) substrate having wirings and a wafer-scale beam deflector array, which is attached to at least one side of the LTCC substrate and has an array of deflection devices deflecting electron beams. In addition, the wafer-scale microcolumn array includes wafer-scale lens arrays attached to the beam deflector array and each have a plurality of lenses whose centers are aligned with the center of the deflection device, and an electron emission source array supplying electron beams to the lens array.

The wirings and the deflection devices can be electrically connected to each other through wiring electrodes. The wiring electrodes are made of a material having excellent electric conduction, for example, silver (Ag). The wiring electrodes are attached to the deflection device using conductive epoxy resin.

The deflection device may be formed so that a plurality of polygonal electrodes that work independently of each other. All electrodes placed at the same relative position in the polygonal electrodes can receive an equal voltage signal.

BRIEF DESCRIPTION OF THE DRAWINGS

The above and other features and advantages of the present invention will become more apparent by describing in detail embodiments thereof with reference to the attached drawings in which:

FIG. 1A is an exploded perspective view of a wafer-scale microcolumn array according to an embodiment of the present invention;

DETAILED DESCRIPTION OF THE INVENTION

The present invention will now be described more fully with reference to the accompanying drawings in which embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1B:
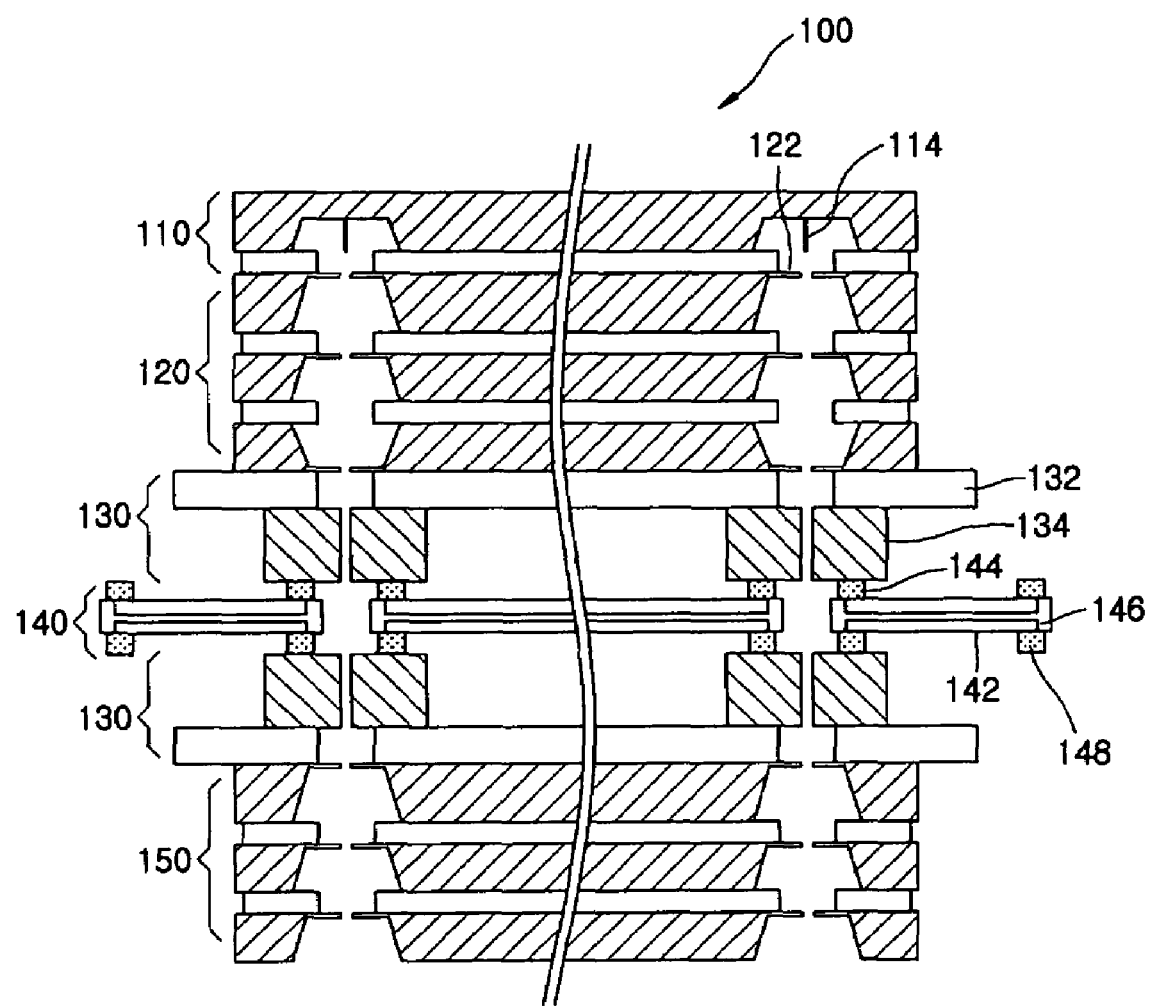
FIG. 1B is a schematic cross-sectional view of FIG. 1A.

FIG. 1A is an exploded perspective view of a wafer-scale microcolumn array 100 according to an embodiment of the present invention, and FIG. 1B is a schematic cross-sectional view of FIG. 1A.

Referring to FIGS. 1A and 1B, when the wafer-scale microcolumn array 100 is formed, wirings between a beam deflector array 130 and electron lens arrays 120 and 150 must be integrated into small spaces. Although use of typical semiconductor process technologies can satisfy this demand, in the case of wirings of a multi-layer structure, the process thereof becomes complicated and expensive. In an embodiment according to the present invention, a multi-layer low temperature co-fired ceramic (LTCC) substrate 140 is used to form wirings for a wafer-scale microcolumn array 100. The multi-layer LTCC substrate 140 can be manufactured by conventional methods.

A wafer-scale microcolumn array 100 includes, for example, an electron emission source array 110, a source lens array 120, beam deflector arrays 130, a LTCC substrate 140, and a focusing lens array 150. The beam deflector arrays 130 are symmetrically placed on both sides of the LTCC substrate 140.

The electron emission source array 110 is, for example, a field emitting device, such as carbon nano tubes (CNTs) or metal-insulator-metal (MIM) array, etc. Electrons 112 emitted from the electron emission source array 110 forms an electron beam source 114. The source lens array 120 and the focusing lens array 150 are thin silicon films having apertures 122 or 164 of several μm to hundreds of μm in diameter formed by a typical MEMS (micro electro mechanical systems) process. The source lens array 120 and the focusing lens array 150 are also called a silicon electrostatic lens. The electrostatic lens is formed to have high electric conductivity by, for example, injecting boron impurities thereinto. In addition, the electrostatic lens has the various apertures 122 or 164. The electrostatic lens having the apertures 122 or 164 performs as an electro-optical lens, which restricts the electron beam source 114 emitted from the electron emission source array 110 and electrostatically converges the electron beam source 114 by an external voltage source.

The beam deflector array 130 includes a plurality of deflection devices 134. Each deflection device 134 is, for example, a silicon octa-electrode deflection device, which has eight polygonal electrodes formed in a radial shape by reactive ion etching (RIE) of silicon. The eight electrodes have a uniform shape and are arranged to work independently of each other. The deflection device 134 is attached to a substrate 132, such as Pyrex™ glass. The deflection device 134 bends electron beams passing through the center of the deflector using an electrostatic force generated by an externally applied voltage.

As illustrated in FIG. 1B, components in the microcolumn array 100 can be attached so as to coaxially align the centers of the electron beam source 114, the apertures 122 in the source lens array 120, the holes in the beam deflector arrays 130, the holes in the LTCC substrate 140, and the apertures 164 in the focusing lens array 150. For example, the centers of the aperture 122, 164 are coaxially aligned along an axis normal to the surfaces of the components. The order of attachment of components for forming the microcolumn array 100 is as follows. First, the beam deflector arrays 130 are electrically attached to both sides of the LTCC substrate 140. The centers of the holes in the beam deflector arrays 130 and the centers of the corresponding holes in the LTCC substrate 140 are coaxially aligned. When the alignment and attachment are performed, the electrical connection of the wirings must be tested. Each of deflection devices 134 is electrically connected through wiring electrodes 144, for example, silver electrodes, formed on a surface 142 of the LTCC substrate 140. Next, the focusing lens array 150, the source lens array 120, and the electron emission source 110 are sequentially aligned and attached.

The source lens array 120, the beam deflector array 130, the LTCC substrate 140 and the focusing lens array 150 can be coaxially aligned using two or more electron beam pathways in the microcolumn array 100. The electron emission source array 110 can be aligned with the top portion of the source lens array 120 using an arbitrary aligning indicator (not illustrated) on the wafer. The electron lens arrays 120 and 150 can be made by anisotropic etching of silicon in a typical KOH solution.

Figure 2A:
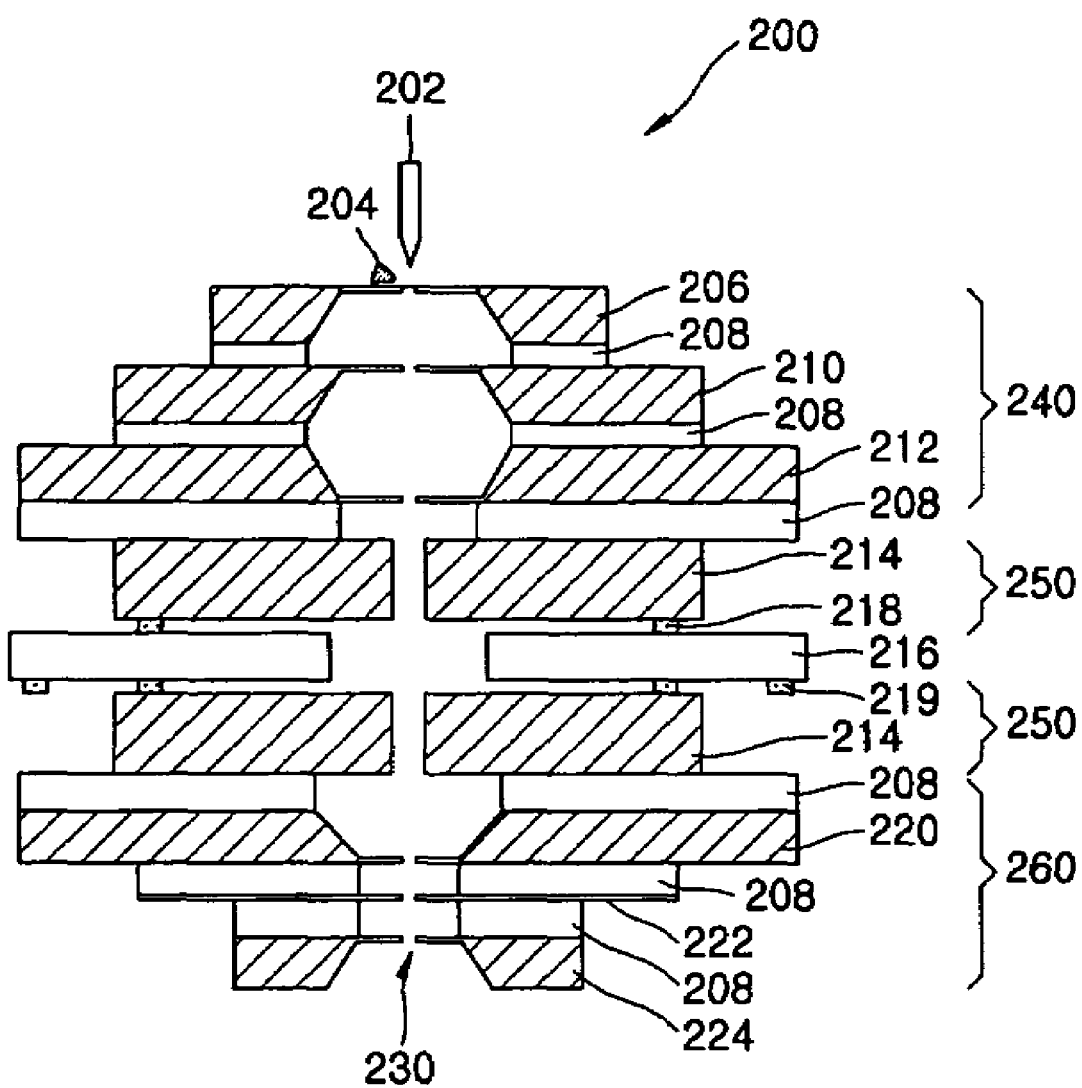
FIG. 2A is a schematic cross-sectional view of a unit microcolumn according to an embodiment of the present invention.
Figure 2B:
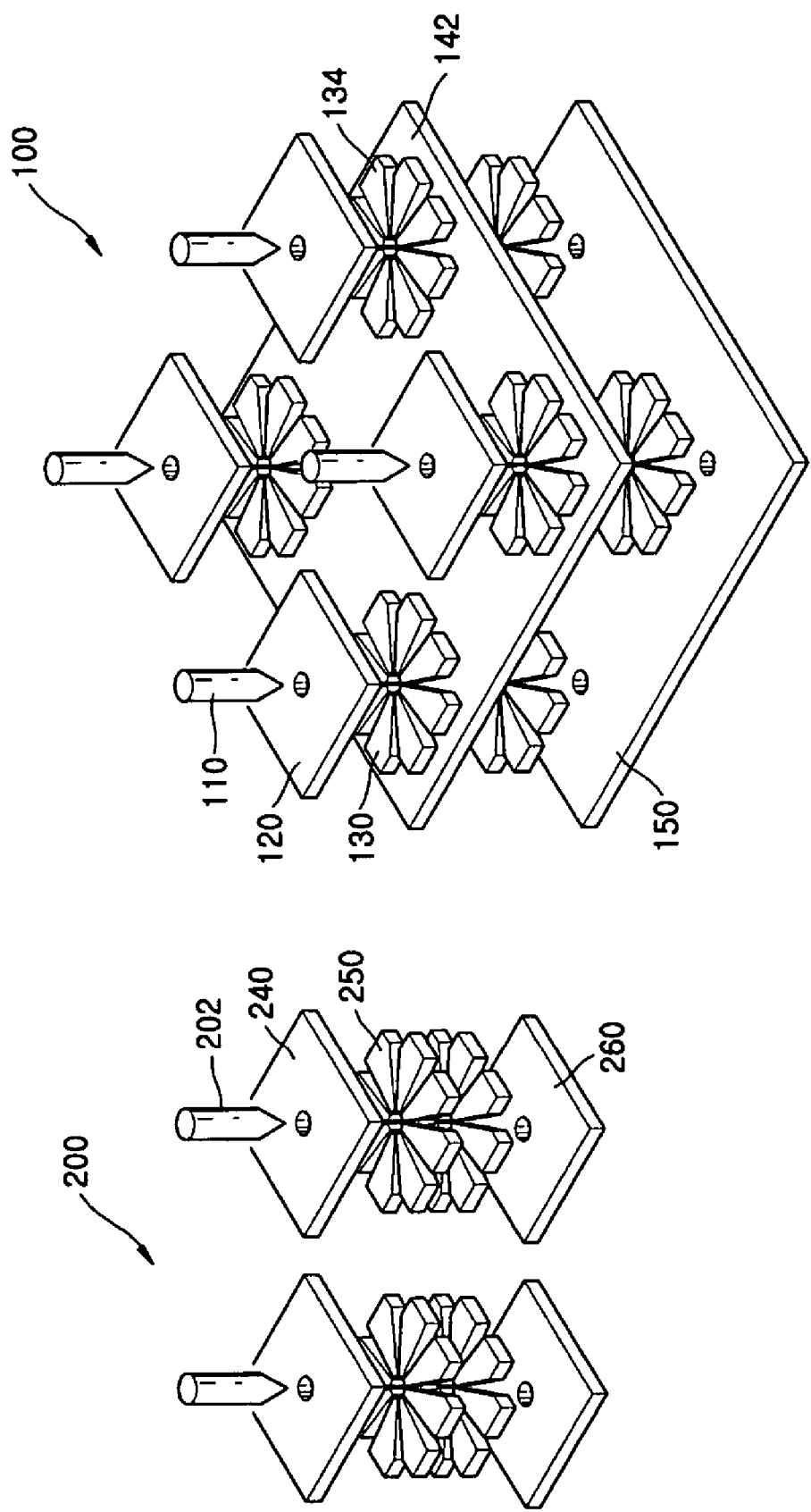
FIG. 2B illustrates exploded perspective views of unit microcolumns and a monolithic microcolumn array according to an embodiment of the present invention.

FIG. 2A is a schematic cross-sectional view of a unit microcolumn 200 according to an embodiment of the present invention. FIG. 2B illustrates exploded perspective views of unit microcolumns and a monolithic microcolumn array 100 according to an embodiment of the present invention. The microcolumn array 100 according to an embodiment of the present invention is an array of unit microcolumns 200. Hereinafter, the unit microcolumn 200 will be described.

Referring to FIGS. 2A and 2B, an electron beam emitted from an electron emission source 202 passes through an aperture 204. Then, the electron beam is converged when passing through a region of a first plurality of electrodes 206, 210 and 212. The first plurality of electrodes 206, 210 and 212 are a materials having excellent electrical conductivity, such as silicon. The converged electron beam is restricted by the electrodes 206, 210 and 212 and becomes thinner. A group of silicon film electrodes, that is, the first plurality of electrodes 206, 210 and 212, which restrict and converge the electron beam emitted from the electron emission source 202, is included in a source lens unit 240. The electron beam passing through the source lens unit 240 is deflected in a desired direction by deflection devices 214 formed in beam deflectors 250 attached to the top and bottom of a LTCC substrate 216. The LTCC substrate 216 is a multi-layer substrate and performs as an insulation layer. Each of the deflection devices 214 is electrically connected through wiring electrodes 218, for example, silver electrodes, formed on a surface of the LTCC substrate 216. The LTCC substrate 216 receives externally applied voltages through external terminals 219.

After the electron beam passes through the beam deflectors 250, it is further converged when it passes through a second plurality of electrodes 220, 222, and 224. A group of silicon film electrodes, that is, the second plurality of electrodes 220, 222, and 224 that converge the electron beam is included in a focusing lens unit 260. The second plurality of electrodes 220, 222, and 224 are called an Einzel lens. The first and second pluralities of electrodes are typically called an electron lens or a micro-lens. Each of the first and second pluralities of electrodes 206, 210, 212, 220, 222, and 224 is attached to an insulator 208, such as Pyrex™ glass, which insulates these electrodes from each other, as shown in FIG. 2A.

The unit microcolumn 200 scans the electron beam, which is deflected by the beam deflectors 250 and converged by the focusing lens unit 260, on a desired site. Therefore, the unit microcolumn 200 can be applied to various fields, for example, drawing a lithography pattern on a surface of a semiconductor wafer or using it as the second scanning electron microscope.

In addition, the unit microcolumn 200 can be arranged to form a wafer-scale microcolumn by combining each component, such as the electron emission source 202, the source lens unit 240, the beam deflector 250 and the focusing lens unit 260, as shown in FIGS. 1A and 1B. That is, each of the components of the unit microcolumn 200 is independently arrayed on a wafer-scale basis. The arrayed wafer-scale components are aligned with each other and attached to each other, resulting in the wafer-scale microcolumn array 100 formed of a plurality of unit microcolumns 200. The unit microcolumns 200 in the wafer-scale microcolumn array 100 work synchronously, thereby allowing synchronous scanning of electron beams on a surface of a semiconductor, so called parallel electron beam lithography.

FIGS. 3A through 3D are schematic cross-sectional views illustrating a method of manufacturing a deflection device according to an embodiment of the present invention.

Figure 3A:
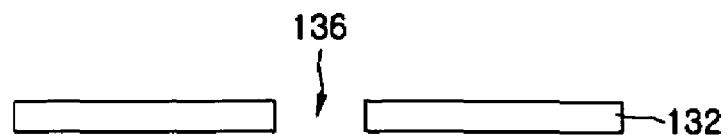
FIGS. 3A through 3D are schematic cross-sectional views illustrating a method of manufacturing a deflection device according to an embodiment of the present invention.
Figure 3B:
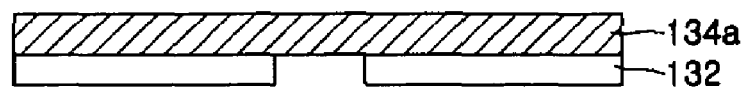
Figure 3C:
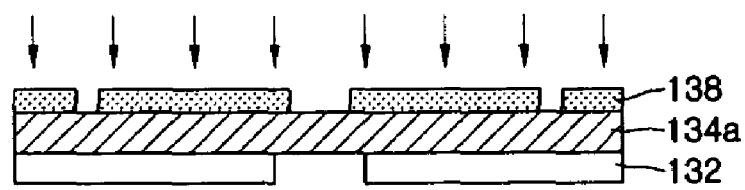
Figure 3D:
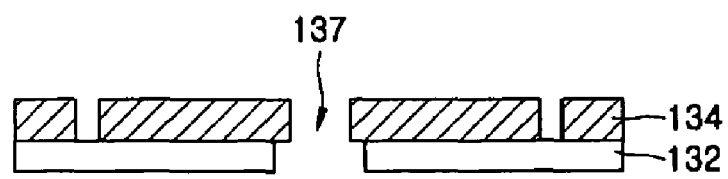

Referring to FIG. 3A, a first hole 136 is formed in a substrate 132 made of, for example, Pyrex™ glass. Next, the glass substrate 132 is attached to a silicon wafer 134a using an anodic contact as shown in FIG. 3B. A photoresist pattern 138 having shapes used to form the deflection devices 134 in the beam deflector 130 is formed as shown in FIG. 3C. The silicon wafer 134a is anisotropically etched using the photoresist pattern 138 as an etching mask by a deep reactive ion etching (RIE) process. Each deflection device has eight polygonal electrodes arranged in a radial shape defining second hole 137 at the center of the deflection device 134. Then, the photoresist pattern 138 is removed.

Figure 4A:
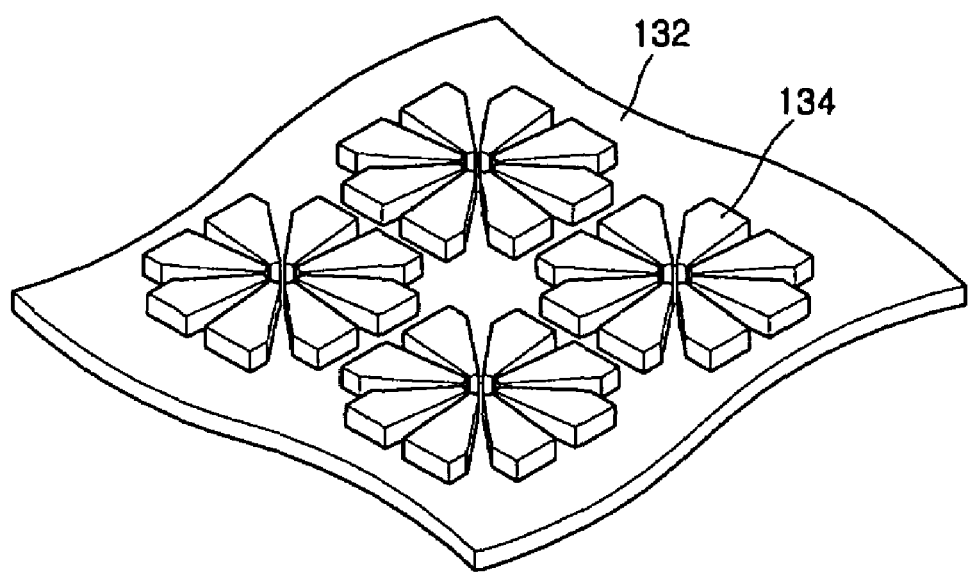
FIG. 4A is a perspective view illustrating an array of four deflection devices according to an embodiment of the present invention.
Figure 4B:
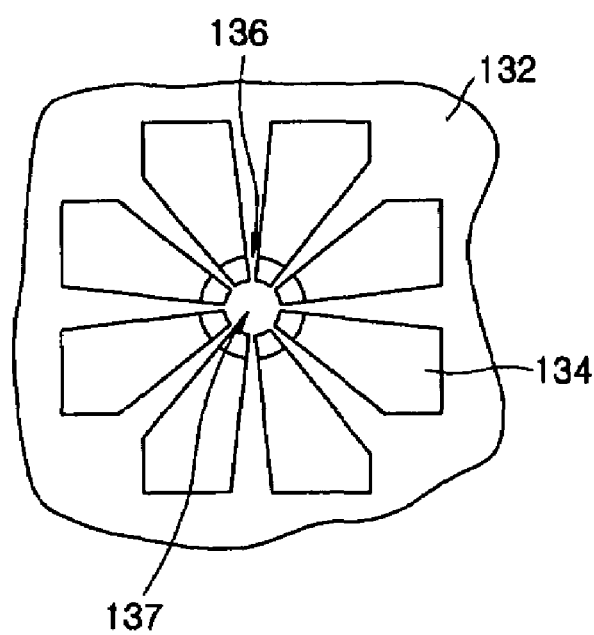
FIG. 4B is a plan view of a deflection device according to an embodiment of the present invention.

FIG. 4A is a perspective view illustrating an array of four deflection devices according to an embodiment of the present invention. FIG. 4B is a plan view of one of the deflection devices.

Referring to FIGS. 4A and 4B, the deflection devices 134 have the same shape and are regularly arranged on the surface of a glass substrate 132. The center of a first hole 136 formed in the glass substrate 132 and the center of a second hole 137 formed at the center of the deflection device 134 may be aligned. In addition, the diameter of the first hole 136 may be larger than that of the second hole 137.

Figure 5:
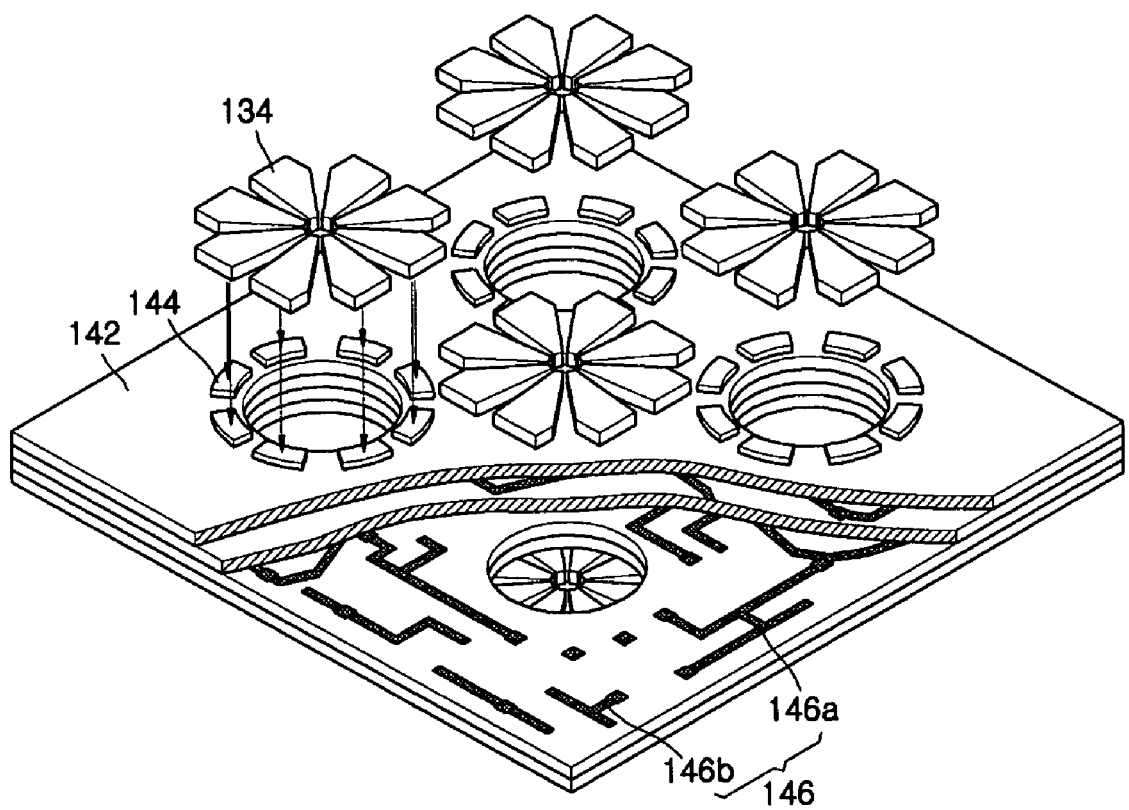
FIG. 5 is an exploded perspective view illustrating a structure made by combining a low temperature co-fired ceramic (LTCC) substrate and a beam deflector array according to an embodiment of the present invention.

FIG. 5 is an exploded perspective view. illustrating a structure made by combining a LTCC substrate 140 and a beam deflector array 130 according to an embodiment of the present invention.

Referring to FIG. 5, three-dimensional networks of wirings 146 are formed on the multi-layer LTCC substrate 140. The wirings 146 in the networks are electrically connected to each of the deflection devices 134 through wiring electrodes 144, for example, silver electrodes formed on the surface of the LTCC substrate 140. Each of the wiring electrodes 144 can receive an externally applied voltage signal through the external terminal 148 (illustrated in FIG. 1B). The wiring electrodes 144 are electrically connected to the deflection device 134 and the LTCC substrate 140 using, for example, a conductive epoxy resin. In addition, electric wirings for the source lens array 120 and the focusing lens array 150 can be formed on the LTCC substrate 140.

Figure 6:
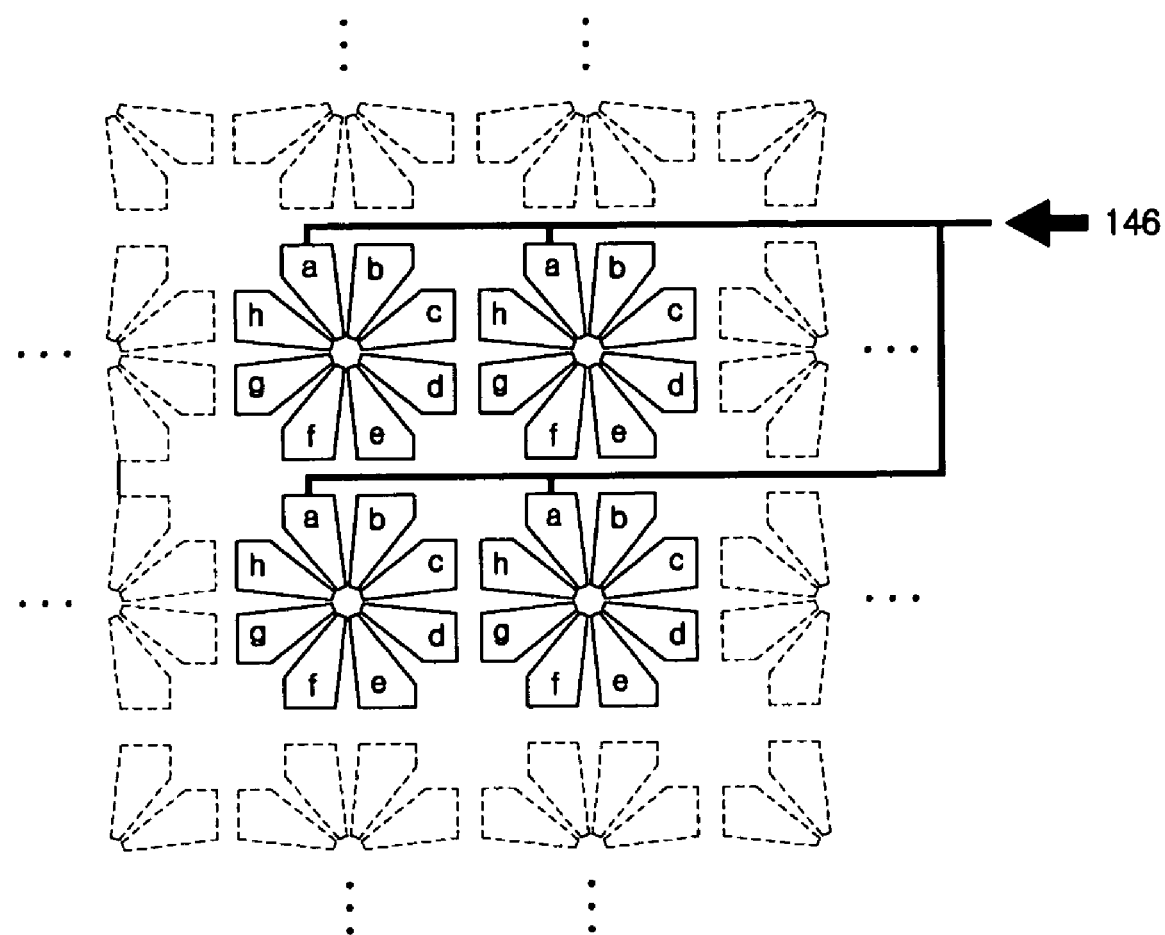
FIG. 6 is a plan view illustrating the operation of a beam deflector array according to an embodiment of the present invention.

FIG. 6 is a plan view illustrating the operation of a beam deflector array 130 according to an embodiment of the present invention.

Referring to FIG. 6, the multi-layer structure of the LTCC substrate 140 allows a plurality of deflection devices 134 in microcolumn array 100 to be driven synchronously by one applied voltage signal. More specifically, since all "a" electrodes in FIG. 6 placed at the same position in each of the deflection devices 134 are connected through a common wiring 146, an external voltage signal is applied to all the "a" electrodes though the common wiring 146, thereby synchronously activating all "a" electrodes. In this manner, "b" through "h" electrodes in the deflection devices can be separately activated. Consequently, eight voltage signals can synchronously activate all the deflection devices 134 in the octa-electrode beam deflector array 130.

The wafer-scale microcolumn array using a LTCC substrate according to the present invention can significantly increase throughput of semiconductor wafers.

In addition, the microcolumn array according to the present invention can have a simper manufacturing process and a lower production cost by using a LTCC substrate.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A wafer-scale microcolumn array using a low temperature co-fired ceramic (LTCC) substrate comprising:
    a LTCC substrate having wirings;
    wafer-scale beam deflector arrays attached to at least one side of the LTCC substrate each comprising a plurality of deflection devices deflecting electron beams, and wherein the beam deflectors are an upper beam deflector and a lower beam deflector with respect to the LTCC substrate,
    a wafer-scale lens array which is attached to the beam deflector array and has a plurality of lenses whose centers are aligned with the center of the deflection device; and a wafer-scale electron emission source array supplying electron beams to the lens array.

2. The microcolumn array of claim 1, wherein the wirings are electrically connected to the deflection devices through wiring electrodes.

3. The microcolumn array of claim 1, wherein the wiring electrodes are silver (Ag) electrodes having excellent electric conductivity.

4. The microcolumn array of claim 1, wherein the wiring electrodes are attached to the deflection devices using a conductive epoxy resin.

5. The microcolumn array of claim 1, wherein the wirings are multi-layer wirings.

6. The microcolumn array of claim 1, wherein each of the deflection devices is formed so that a plurality of polygonal electrodes work independently.

7. The microcolumn array of claim 6, wherein each of the deflection devices comprises eight electrodes.

8. The microcolumn array of claim 6, wherein a predetermined voltage signal is applied to all electrodes that are located at the same relative position in each of a plurality of deflection devices of a deflector array.

9. The microcolumn array of claim 1, wherein, the deflection devices are attached to a glass substrate.

10. The microcolumn array of claim 1, wherein the lens array comprises a source lens array neighboring the electron emitting source array and a focusing lens array placed under the wafer.

11. The microcolumn array of claim 10, wherein the center of the source lens array and the center of the focusing lens array are coaxially aligned along an axis normal to the focusing lens array.

* * * * *